(12) United States Patent
Derai et al.

(10) Patent No.: US 11,887,959 B2
(45) Date of Patent: Jan. 30, 2024

(54) CHIP-ON-LEAD SEMICONDUCTOR DEVICE, AND CORRESPONDING METHOD OF MANUFACTURING CHIP-ON-LEAD SEMICONDUCTOR DEVICES

(71) Applicant: STMicroelectronics S.r.l., Agrate Brianza (IT)

(72) Inventors: Michele Derai, Milan (IT); Guendalina Catalano, Augusta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 108 days.

(21) Appl. No.: 17/549,515

(22) Filed: Dec. 13, 2021

(65) Prior Publication Data

US 2022/0199564 A1 Jun. 23, 2022

(30) Foreign Application Priority Data

Dec. 17, 2020 (IT) .......................... 102020000031229

(51) Int. Cl.
*H01L 23/495* (2006.01)
*H01L 23/00* (2006.01)

(52) U.S. Cl.
CPC .......... *H01L 24/24* (2013.01); *H01L 23/4951* (2013.01); *H01L 23/49513* (2013.01);
(Continued)

(58) Field of Classification Search
CPC ......... H01L 24/24; H01L 24/19; H01L 24/25; H01L 23/4951; H01L 23/49513
See application file for complete search history.

(56) References Cited

U.S. PATENT DOCUMENTS 10,796,981 B1 * 10/2020 Chiang ............. H01L 23/49575
2005/0253230 A1 11/2005 Punzalan et al.
(Continued)

FOREIGN PATENT DOCUMENTS

EP 3719834 A1 10/2020

OTHER PUBLICATIONS

IT Search Report and Written Opinion for priority application, IT 102020000031229, report dated Aug. 20, 2021, 9 pages.

*Primary Examiner* — Nathan W Ha
(74) *Attorney, Agent, or Firm* — Crowe & Dunlevy

(57) ABSTRACT

A semiconductor device includes a support substrate with leads arranged therearound, a semiconductor die on the support substrate, and a layer of laser-activatable material molded onto the die and the leads. The leads include proximal portions facing towards the support substrate and distal portions facing away from the support substrate. The semiconductor die includes bonding pads at a front surface thereof which is opposed to the support substrate, and is arranged onto the proximal portions of the leads. The semiconductor device has electrically-conductive formations laser-structured at selected locations of the laser-activatable material. The electrically-conductive formations include first vias extending between the bonding pads and a front surface of the laser-activatable material, second vias extending between the distal portions of the leads and the front surface of the laser-activatable material, and lines extending at the front surface of the laser-activatable material and connecting selected first vias to selected second vias.

18 Claims, 5 Drawing Sheets

(52) U.S. Cl.
CPC .............. *H01L 24/19* (2013.01); *H01L 24/25* (2013.01); *H01L 2224/2405* (2013.01); *H01L 2224/24246* (2013.01); *H01L 2224/2505* (2013.01); *H01L 2224/25175* (2013.01); *H01L 2924/182* (2013.01)

(56) References Cited

U.S. PATENT DOCUMENTS

| | | | |
|---|---|---|---|
| 2013/0208439 A1* | 8/2013 | Aripin ................. | H01L 23/4951 |
| | | | 361/813 |
| 2013/0334712 A1* | 12/2013 | Meyer-Berg ........ | H01L 25/0655 |
| | | | 438/107 |
| 2016/0064310 A1* | 3/2016 | Sirinorakul ......... | H01L 23/4951 |
| | | | 257/676 |
| 2016/0104662 A1* | 4/2016 | Prajuckamol ........... | H01L 24/32 |
| | | | 257/676 |
| 2016/0225717 A1* | 8/2016 | Palm .................... | H01L 23/5386 |
| 2016/0372432 A1* | 12/2016 | Tan ..................... | H01L 23/3121 |
| 2017/0162481 A1* | 6/2017 | Lin ......................... | H01L 24/72 |
| 2018/0130747 A1* | 5/2018 | Tuominen ........... | H01L 23/5389 |
| 2018/0204802 A1* | 7/2018 | Lin ...................... | H01L 23/5386 |
| 2019/0115287 A1* | 4/2019 | Derai ..................... | H01L 24/73 |
| 2020/0161206 A1* | 5/2020 | Hu ...................... | H01L 23/5386 |
| 2021/0013134 A1* | 1/2021 | Derai ..................... | H01L 24/73 |
| 2021/0050299 A1* | 2/2021 | Ziglioli ................ | H01L 21/565 |
| 2021/0183748 A1* | 6/2021 | Derai ..................... | H01L 24/82 |
| 2021/0305191 A1* | 9/2021 | Tiziani .................. | H01L 24/19 |
| 2022/0020669 A1* | 1/2022 | McKnight-MacNeil .................... |  |
| | | | H01L 24/25 |
| 2022/0037280 A1* | 2/2022 | Tang ...................... | H01L 24/92 |
| 2022/0068741 A1* | 3/2022 | Magni ................. | H01L 23/3107 |
| 2022/0230948 A1* | 7/2022 | Ogura ................. | H01L 23/3107 |
| 2023/0035445 A1* | 2/2023 | Vitello ................. | H01L 21/561 |

* cited by examiner

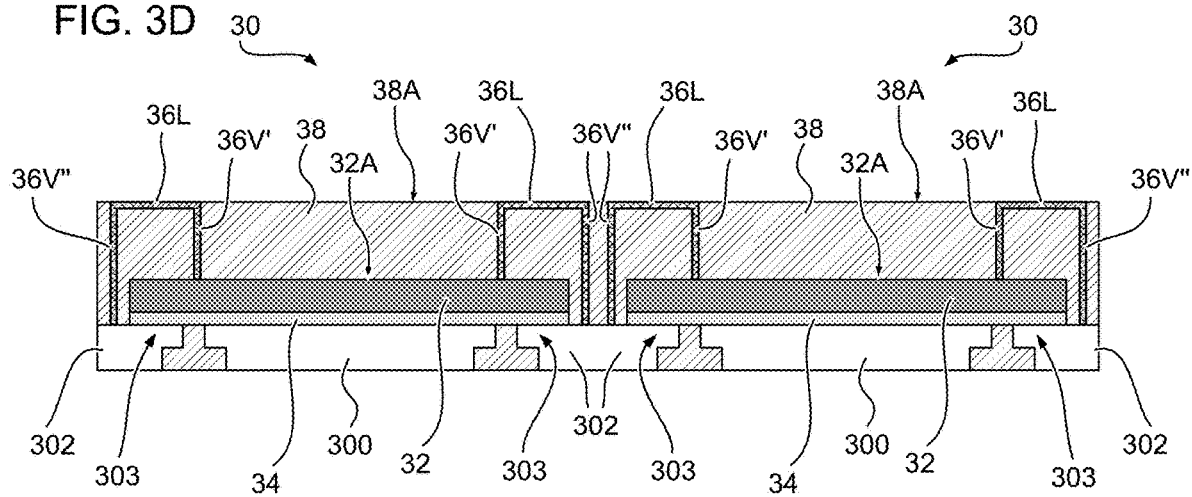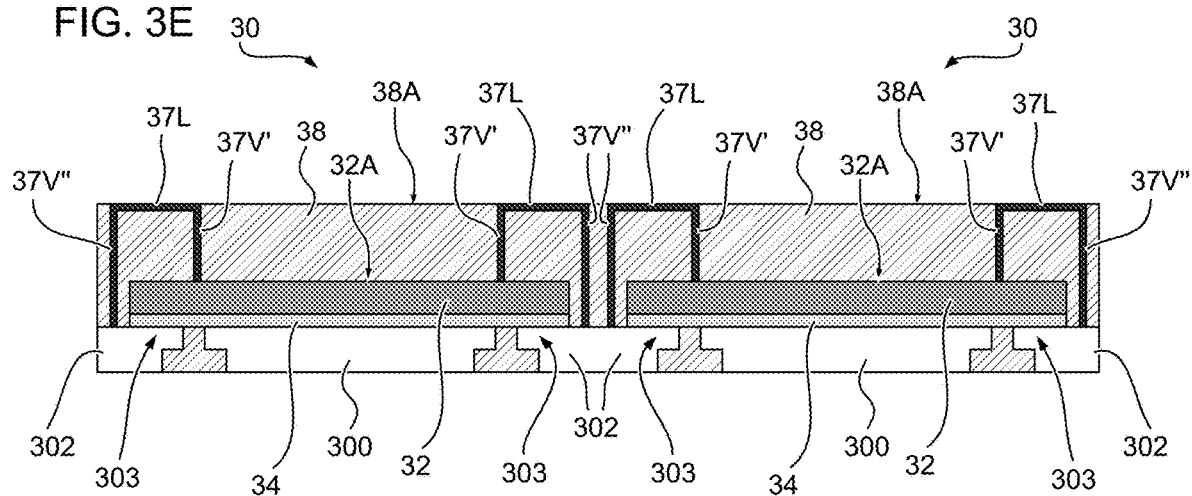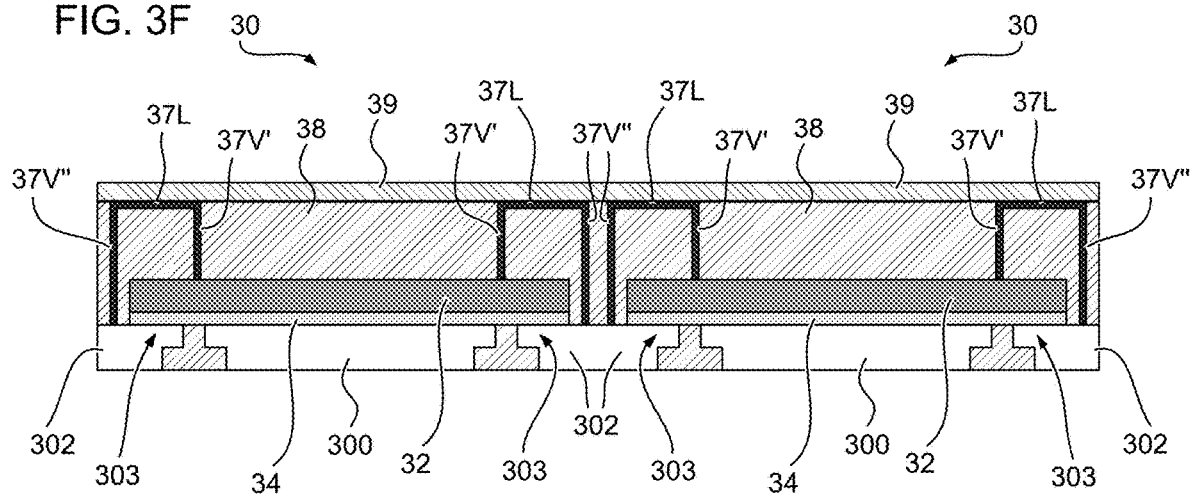

CHIP-ON-LEAD SEMICONDUCTOR DEVICE, AND CORRESPONDING METHOD OF MANUFACTURING CHIP-ON-LEAD SEMICONDUCTOR DEVICES

PRIORITY CLAIM

This application claims the priority benefit of Italian Application for Patent No. 102020000031229, filed on Dec. 17, 2020, the content of which is hereby incorporated by reference in its entirety to the maximum extent allowable by law.

TECHNICAL FIELD

The description herein relates to semiconductor devices including a chip-on-lead arrangement, which may be suitable for use in various sectors such as automotive, industrial, and/or consumer electronics.

BACKGROUND

Conventional packaged semiconductor devices may comprise a metallic leadframe, including a die pad and a set of electrically-conductive leads arranged around the die pad (e.g., extending radially therearound), and at least one semiconductor die or chip arranged on the die pad (e.g., attached thereon). The semiconductor die arranged on the die pad may comprise a set of bonding pads at its front surface which is opposed to the die pad (e.g., a surface which may be conventionally designated as a top or upper surface). The bonding pads may be electrically coupled to the leads of the leadframe by bonding wires (e.g., gold wires). The semiconductor device may further comprise an encapsulation casing of plastic material (e.g., a resin) which encapsulates the semiconductor die arranged on the die pad, the bonding wires, and at least a portion of the electrically-conductive leads facing towards the die pad, in order to prevent damage or corrosion thereof.

In a conventional chip-on-lead semiconductor device, the semiconductor die may be larger than the die pad of the leadframe. Therefore, the semiconductor die may protrude "laterally" from the area of the die pad on which it is arranged, and it may be arranged (at least partially) on the end portions of (at least some of) the leads which face towards the die pad (e.g., the portions of the leads which are "proximal" to the die pad). This particular arrangement facilitates accommodating a relatively large semiconductor die in a relatively small package.

In a chip-on-lead semiconductor device, the (lateral) side walls of the semiconductor die may be located at a short distance from the (lateral) side walls of the encapsulation casing, and the area of the leads available for wire bonding inside the casing may be reduced. Therefore, electrically coupling the bonding pads of the semiconductor die to the leads may be cumbersome, and the reliability of the wire bonding operation in a chip-on-lead semiconductor device may be negatively affected.

Therefore, there is a need in the art to provide improved bonding techniques for chip-on-lead semiconductor devices.

There is a need in the art to contribute in providing such improved bonding techniques for chip-on-lead semiconductor devices.

SUMMARY

One or more embodiments may relate to a semiconductor device.

One or more embodiments may relate to a corresponding method of manufacturing semiconductor devices.

In one or more embodiments, a semiconductor device may include a support substrate, electrically-conductive leads arranged around the support substrate, a semiconductor die arranged onto the support substrate, and a layer of laser-activatable material molded onto the semiconductor die and the leads. The leads may have respective proximal portions facing towards the support substrate and respective distal portions facing away from the support substrate. The semiconductor die may have a set of bonding pads at a front surface thereof which is opposed to the support substrate, and it may be arranged also onto the proximal portions of one or more of the leads. The semiconductor device may comprise electrically-conductive formations laser-structured at selected spatial locations of the laser-activatable material. The electrically-conductive formations may comprise first vias extending between the bonding pads of the semiconductor die and a front surface of the layer of laser-activatable material, second vias extending between the distal portions of the leads and the front surface of the layer of laser-activatable material, and lines extending at the front surface of the layer of laser-activatable material and connecting selected first vias to selected second vias.

One or more embodiments may thus facilitate fitting a relatively large semiconductor die into a relatively small package, while providing reliable electrical connections between the semiconductor die and the leads even within a small space.

BRIEF DESCRIPTION OF THE DRAWINGS

One or more embodiments will now be described, by way of example only, with reference to the annexed figures, wherein:

FIGS. 3A to 3H are cross-sectional lateral views exemplary of certain steps of a method of manufacturing a chip-on-lead semiconductor device according to one or more embodiments of the present description;

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for brevity.

Figure 1:
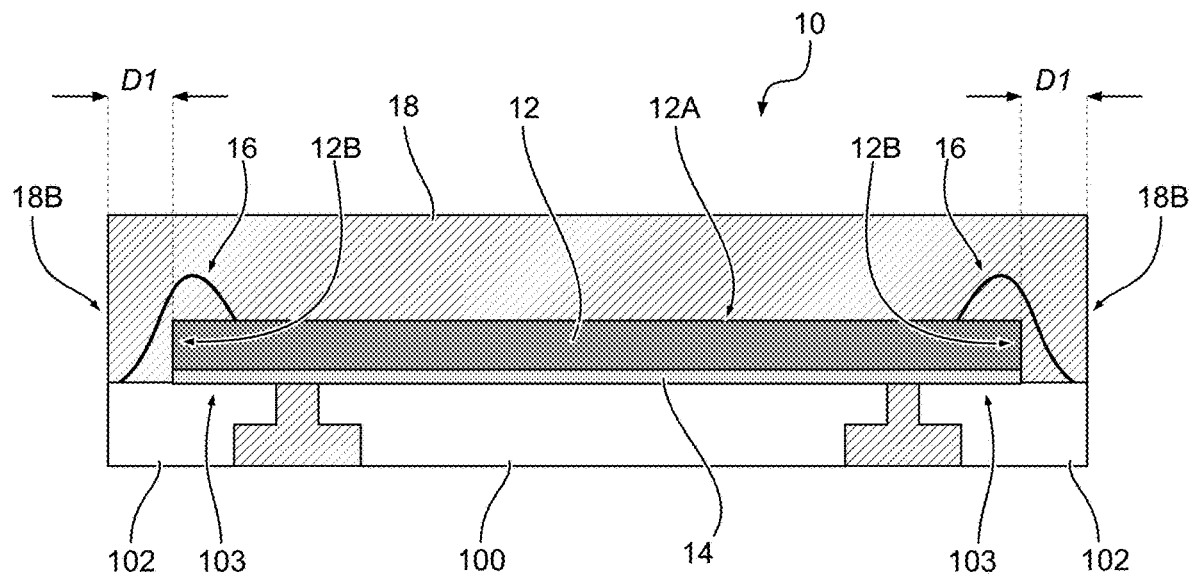
FIGS. 1 and 2 are cross-sectional lateral views exemplary of certain components of conventional chip-on-lead semiconductor devices.
Figure 2:
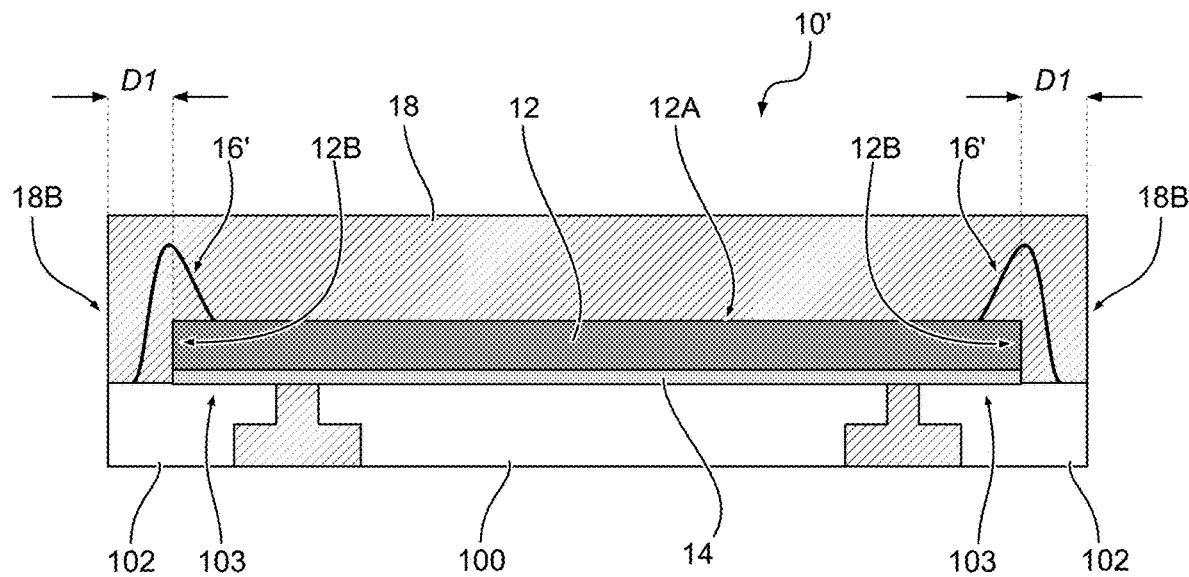

By way of introduction to the detailed description of exemplary embodiments, reference may first be made to FIGS. 1 and 2, which are cross-section side views exemplary of conventional chip-on-lead semiconductor devices 10 and 10', respectively. In particular, the semiconductor devices 10 and 10' exemplified herein comprise a flat no-lead package (e.g., a QFN package).

As exemplified in FIGS. 1 and 2, a conventional chip-on-lead semiconductor device comprises a leadframe (e.g., a metallic leadframe) including a die pad 100 and a plurality of electrically-conductive leads 102 arranged around the die pad 100. A semiconductor die 12 is arranged on the die pad 100, e.g., attached by non-conductive die attachment material 14. In the cases where the semiconductor die 12 is larger (e.g., wider and/or longer) than the die pad 100, it protrudes laterally from the die pad 100 and is arranged on the proximal end portions 103 of the leads 102 which face towards the die pad 100. For instance, a peripheral portion of the semiconductor die 12 may be attached onto the proximal end portions 103 of the leads 102 by the same non-conductive die attach material 14 used for attaching the semiconductor die 12 to the die pad 100.

As exemplified in FIGS. 1 and 2, a conventional chip-on-lead semiconductor device may comprise bonding wires 16 (see FIG. 1) or 16' (see FIG. 2) arranged to electrically couple the bonding pads provided on the front (e.g., top or upper) surface 12A of the semiconductor die 12 to the leads 102. The semiconductor device also comprises an encapsulation casing 18 (e.g., a molded casing) including a plastic material which encapsulates the semiconductor die 12, the die pad 100, the bonding wires 16 and at least a portion of the electrically-conductive leads 102 facing towards the die pad 100. Purely by way of example, a conventional QFN chip-on-lead semiconductor device 10, 10' may have maximum lateral sizes of 5 mm×5 mm (1 mm=$10^{-3}$ m).

As a result of the semiconductor die 12 being arranged on the proximal end portions 103 of the leads 102, the distance (or clearance) D1 between the (lateral) side walls 12B of the semiconductor die 12 and the (lateral) side walls 18B of the encapsulation casing 18 may be short, e.g., about 0.3 mm. Therefore, the area available on the leads 102 for performing a wire bonding process may be limited, possibly resulting in a poor reliability of the wire bonding process.

For instance, as exemplified in FIG. 1, the bonding wires 16 may be arranged with a high "landing angle" on the lead 102, which may result in the bonding stitches being mechanically stressed during the wire bonding process. Additionally, the bonding wires 16 may be arranged in close proximity to the upper edges of the semiconductor die 12, with the risk of being brought into contact with the semiconductor die 12, before or after the molding of the encapsulation casing 18.

As exemplified in FIG. 2, the bonding wires 16' may be arranged so as to maintain a safe distance from the upper edges of the semiconductor die 12, but this may result in a wire loop height too aggressive, with the risk of sagging and/or breaking the wires 16' during or after the molding of the encapsulation casing 18.

One or more embodiments of the present description thus relate to a chip-on-lead semiconductor device comprising die-to-lead interconnections implemented by a Laser Direct Structuring (LDS) technology, which facilitates increasing the reliability of the bonding process and providing reliable electrical connections to the leads even within small spaces.

FIGS. 3A to 3H described in the following are cross-section lateral views exemplary of certain steps of a method of manufacturing a chip-on-lead semiconductor device 30 according to one or more embodiments of the present description. It is noted that various details of the semiconductor device itself will be disclosed with reference to a possible manufacturing method thereof, for the sake of ease of understanding. It is also noted that FIGS. 3A to 3H show a pair of semiconductor devices 30 being manufactured, insofar as conventional manufacturing processes in the semiconductor industry are carried out on batches of devices which share a common substrate or leadframe, which is severed at the end of the manufacturing process to separate the individual devices one from the others (e.g., during a so-called "singulation" step).

Figure 3A:
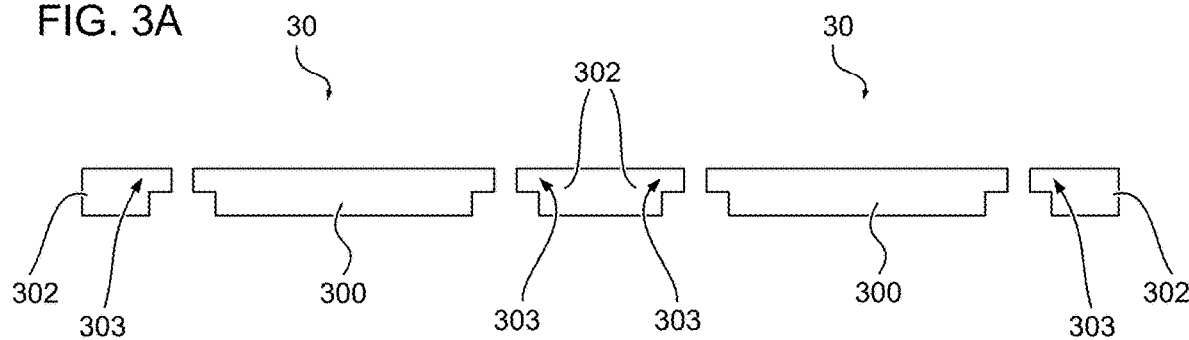

As exemplified in FIG. 3A, a method according to one or more embodiments may comprise the step of providing an otherwise conventional leadframe. For each semiconductor device 30, the leadframe may comprise a die pad 300 and respective leads 302 arranged around the die pad 300. The leads 302 may comprise respective proximal (end) portions 303 facing towards the die pad 300.

It is noted that, while the present description refers mainly to the provision of a "leadframe" (e.g., a metallic leadframe), one or more embodiments may comprise a non-conductive support substrate in place of a die pad 300, the support substrate having electrically-conductive formations integrated therein and acting as the "leads", as is the case, for instance, in ball grid array (BGA) packages.

Figure 3B:
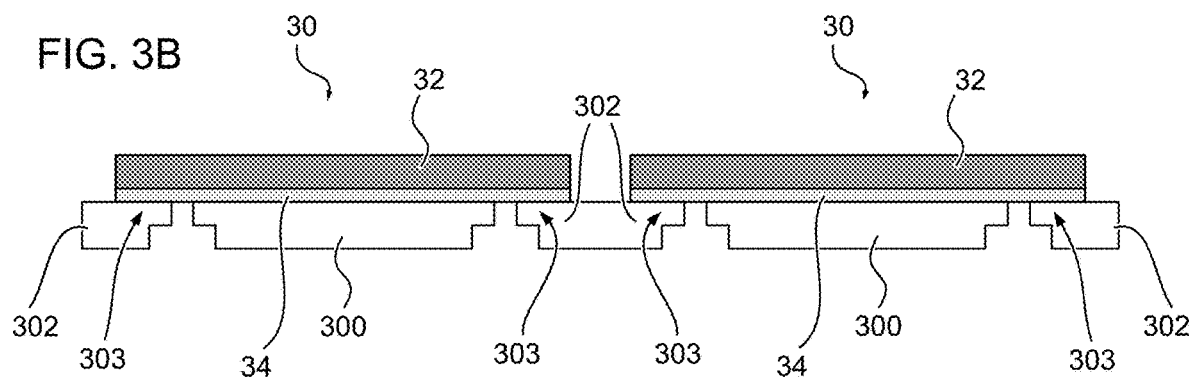

As exemplified in FIG. 3B, a method according to one or more embodiments may comprise the step of arranging a semiconductor die 32 on each die pad 300 of the leadframe, resorting to a chip-on-lead configuration. For instance, a semiconductor die 32 may be attached on a die pad 300 via a die attach material 34, e.g., a die attach film. Since the semiconductor die 32 may be larger (e.g., wider and/or longer) than the die pad 300, it may protrude laterally from the die pad 300 and may be arranged on the end portions 303 of (at least some of) the leads 302 which face towards the die pad 300. For instance, a peripheral portion of the semiconductor die 32 may be attached onto the proximal end portions 303 of the leads 302 by a non-conductive die attach material 34, e.g., a non-conductive die attach film. Optionally, such non-conductive die attach material may be the same die attach material used for attaching the semiconductor die 32 to the die pad 300 (e.g., a continuous adhesive film 34 may be provided on the die pad 300 and the end portions 303 of the leads 302).

It is noted that, while the present description refers mainly to the provision of a semiconductor die 32 which is larger than the die pad 300, one or more embodiments may be applicable in any case where the semiconductor die is at least partially arranged on the leads 302, independently from its dimensions. For instance, a multi-die semiconductor device may comprise a plurality of semiconductor dies arranged on the die pad 300, none of which is larger than the die pad 300, but with at least one of them being at least partially arranged on the leads 302 (e.g., in order to accommodate plural dies properly spaced from each other and/or to accommodate the die-to-die interconnections).

Figure 3C:
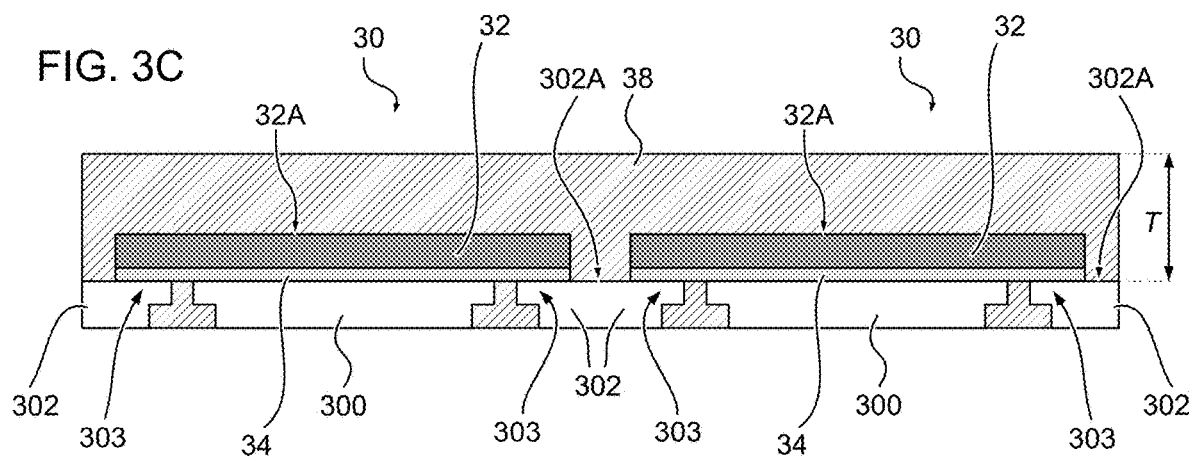

As exemplified in FIG. 3C, a method according to one or more embodiments may comprise the step of providing (e.g., molding) a layer of laser-activatable material 38 (e.g., a resin material suitable for carrying out a Laser Direct Structuring (LDS) process) onto the semiconductor die 32 and the leads 302 to encapsulate the semiconductor die 32 and the leadframe, leaving exposed a rear (e.g., bottom or lower) side of the die pad 300 and of the leads 302.

Purely by way of example, the layer of laser-activatable material 38 may have a thickness T, measured from a front (e.g., top or upper) surface of the substrate (e.g., a front surface 302A of the leads 302 or a front surface of the die pad 300), which is at least 100 μm. Optionally, the thickness T may be in the range of 100 μm to 140 μm, optionally 110 μm to 130 μm, optionally about 120 μm (1 μm=$10^{-6}$ m).

According to the LDS technology, a metallic inorganic compound activatable by laser radiation may be provided in the plastic material used for molding the package of the semiconductor device 30 (or at least a portion 38 of the encapsulation casing which is in contact with the semiconductor die 32). Laser radiation may then be directed onto the laser-activatable plastic material 38 to pattern the course of the circuit trace on and in the laser-activatable plastic material. Where the laser radiation hits the plastic material, the metal additive forms a laser-activated (e.g., micro-rough) track or line. The metal particles of this laser-activated track or line form the nuclei for a subsequent metallization step which will grow an electrically-conductive track on the laser-activated plastic material.

As exemplified in FIG. 3D, a method according to one or more embodiments may comprise the step of directing laser radiation onto the laser-activatable material 38 to pattern (or structure) a set of laser-activated lines 36L at the front (e.g., top or upper) surface 38A of the laser-activatable material 38, as well as laser-activated vias 36V extending through the laser-activatable material 38 (Through Mold Vias, TMW). The laser-activated vias 36V may comprise vias 36V' configured to couple the laser-activated lines 36L extending at the front surface 38A to the bonding pads provided on the front surface 32A of the semiconductor die 32, and vias 36V" configured to couple the laser-activated lines 36L to the bonding areas on the leads 302. Such laser-activated lines and vias 36L, 36V will thus be used as "seed" lines and vias for one or more subsequent plating steps, in order to provide electrical connections between the bonding pads provided on the front surface 32A of the semiconductor die 32 and the leads 302. Various advantageous details of the laser-activated lines and vias 36L, 36V will be discussed in the following with reference to FIGS. 4A and 4B.

As exemplified in FIG. 3E, a method according to one or more embodiments may comprise the step of depositing (e.g., growing) a metallic layer (e.g., a copper layer) onto the laser-activated lines and vias 36L, 36V to provide respective electrically-conductive lines and vias 37L, 37V. The electrically-conductive vias 37V (Through Mold Vias, TMW) may thus comprise vias 37V' configured to couple the electrically-conductive lines 37L extending at the front surface 38A to the bonding pads provided on the front surface 32A of the semiconductor die 32, and vias 37V" configured to couple the electrically-conductive lines 37L to the bonding areas on the leads 302.

The metallic layer may be deposited onto the laser-activated lines and vias 36L, 36V by electroless deposition and/or by galvanic deposition (electroplating). Optionally, a first electroless plating step may be carried out to provide a first thin layer of metallic material (e.g., having a thickness of a few micrometers such as between 2 μm and 5 μm), and a second electroplating step may be carried out to provide a second thick layer of metallic material (e.g., having a thickness of a few tens of micrometers such as between 10 μm and 100 μm) onto the first metallic layer. Various advantageous details of the electrically-conductive lines and vias 37L, 37V will be discussed in the following with reference to FIGS. 4A and 4B.

As exemplified in FIG. 3F, a method according to one or more embodiments may comprise the step of providing an encapsulation layer 39 (e.g., comprising plastic material) to encapsulate the electrically-conductive lines 37L. The material of the encapsulation layer 39 may be, for instance, the same plastic material used for carrying out the LDS process, with or without the laser-activatable metal additive compound. Alternatively, the material of the encapsulation layer 39 may be a different one (e.g., a resist material) and may be deposited by means of any suitable deposition technique.

Figure 3G:
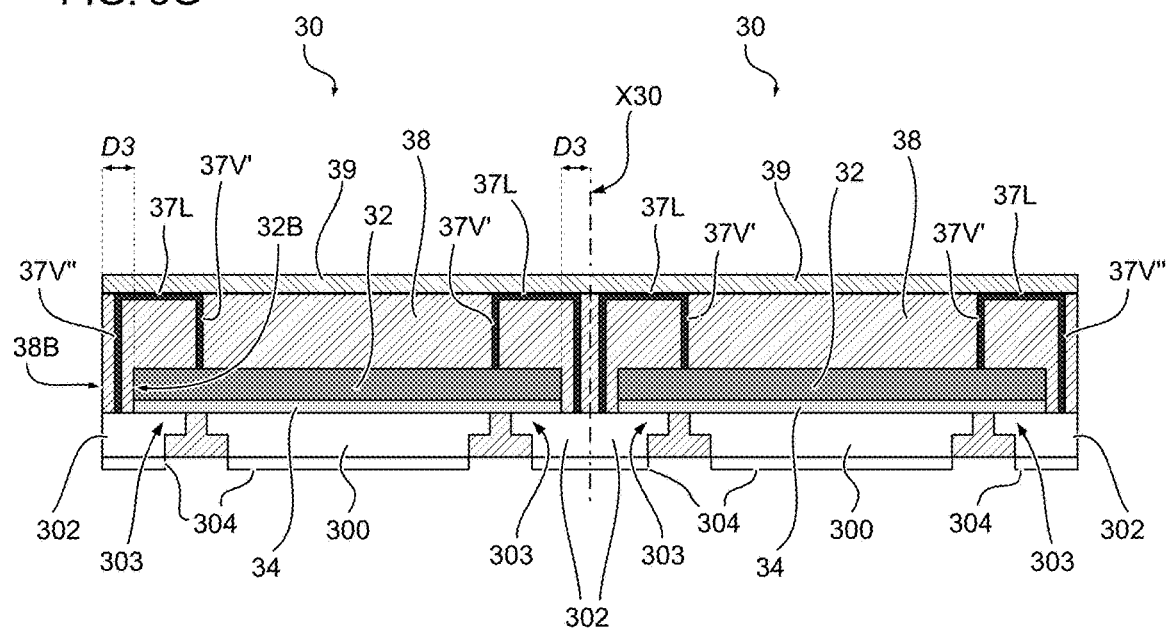

As exemplified in FIG. 3G, a method according to one or more embodiments may comprise the step of providing (e.g., plating) a metallic layer 304 at the exposed (rear) surfaces of the die pads 300 and/or the leads 302 after the encapsulation of the semiconductor device 30 exemplified in FIG. 3F. The metallic layer 304 may comprise tin (Sn). Such a step is purely optional and may be avoided, for instance, in case the leadframe is of the pre-plated type (e.g., it is provided from the outset with a tin plating layer at its rear surface).

Figure 3H:
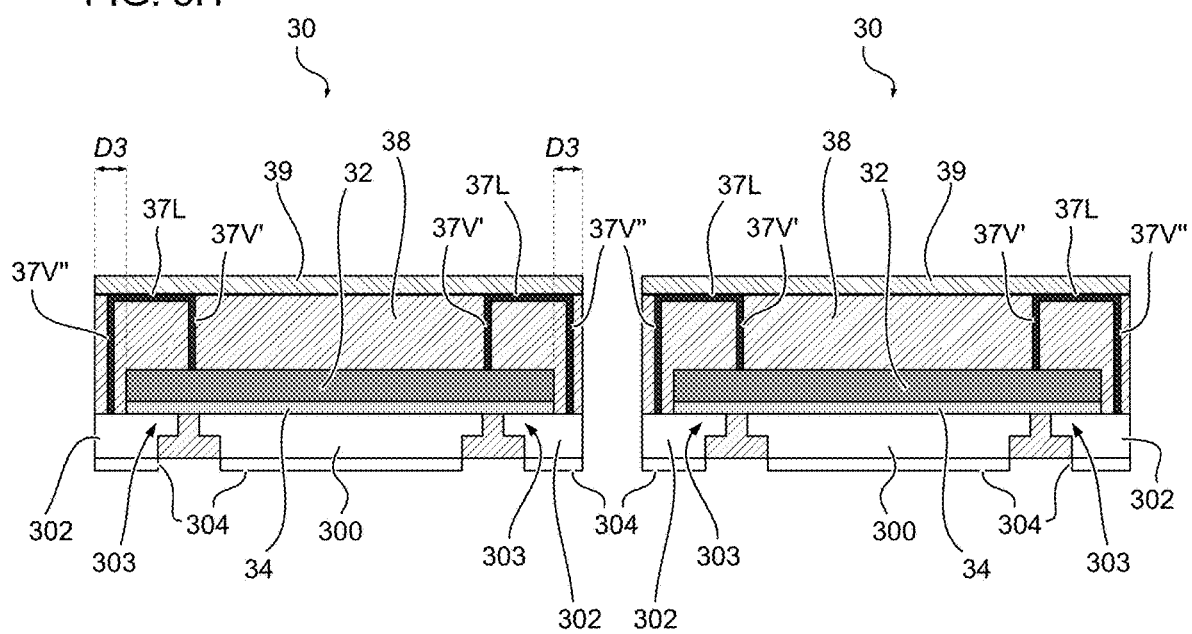

As exemplified in FIG. 3H, a method according to one or more embodiments may comprise the step of separating the semiconductor devices 30 one from the other, e.g., by cutting or sawing along sawing lines X30 ("singulation" step).

Resorting to the LDS technology for manufacturing the die-to-lead interconnections 37L, 37V may therefore facilitate the provision of reliable electrical connections even in case the distance (or clearance) D3 between the (lateral) side walls 32B of the semiconductor die 32 and the (lateral) side walls 38B of the encapsulation casing 38 is short, as in the chip-on-lead QFN semiconductor devices exemplified herein.

Figure 4A:
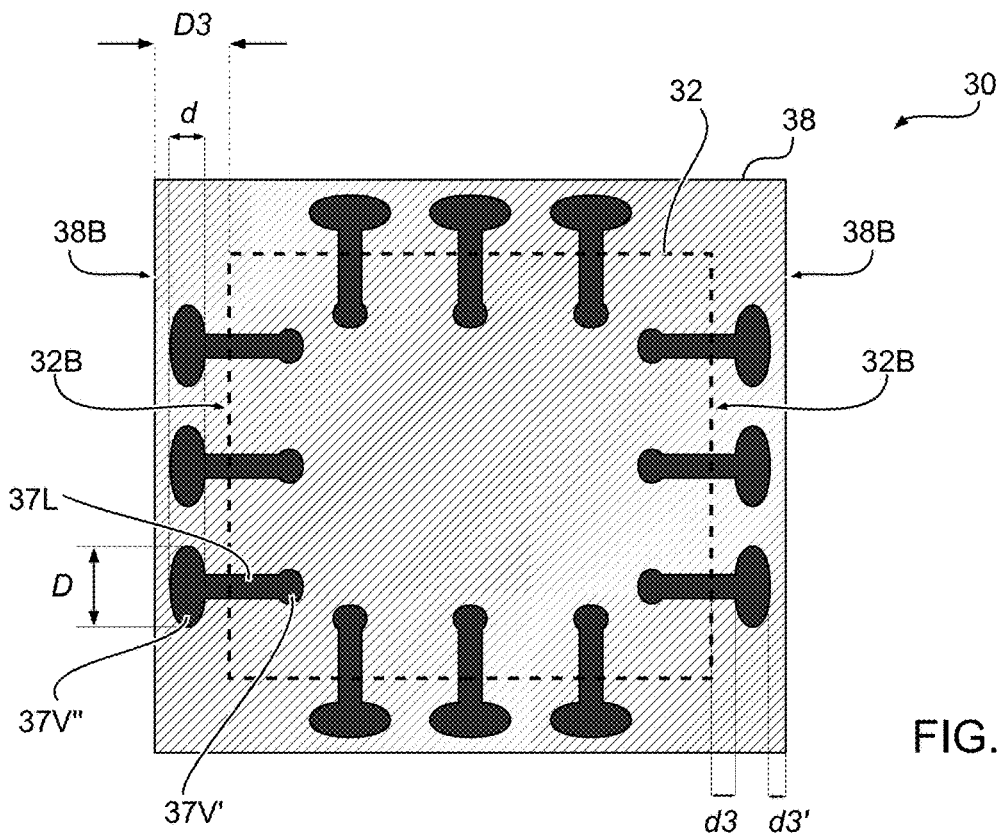
FIG. 4A is a plan view of a front (e.g., top or upper) surface of a chip-on-lead semiconductor device according to one or more embodiments of the present description after a metal deposition step as exemplified in FIG. 3E.
Figure 4B:
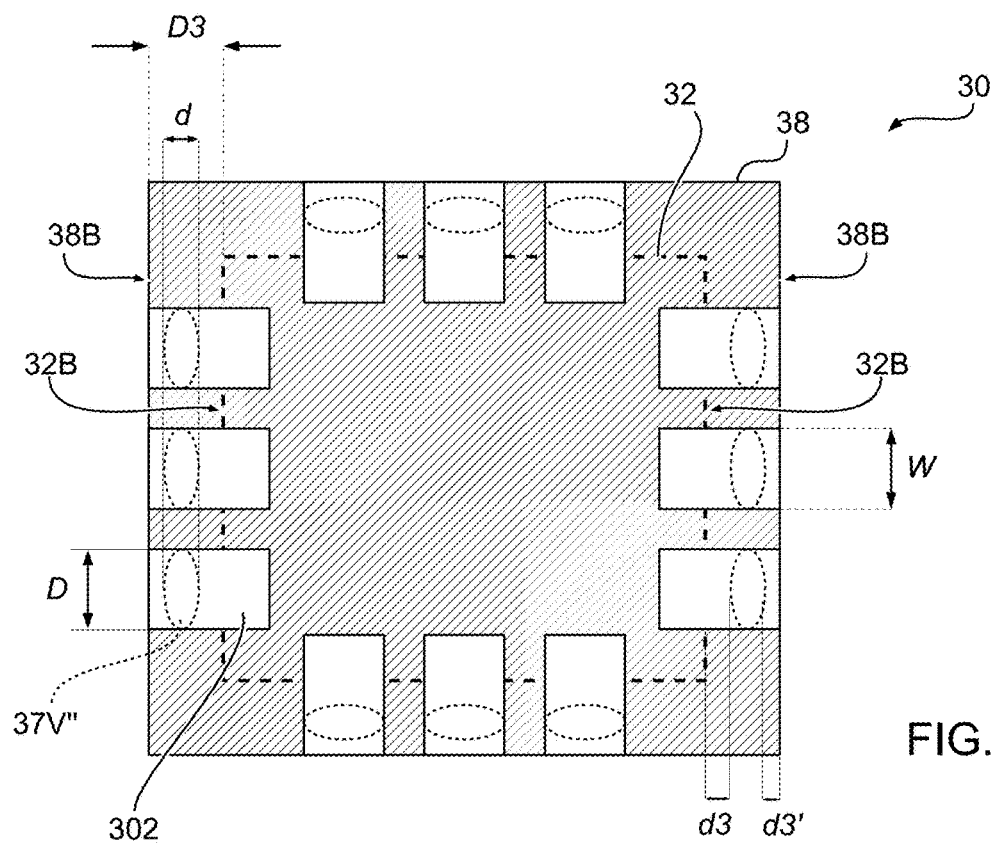
FIG. 4B is a plan view of a rear (e.g., bottom or lower) surface of a chip-on-lead semiconductor device according to one or more embodiments of the present description after a metal deposition step as exemplified in FIG. 3E.

To this regard, reference may be made to FIGS. 4A and 4B, which are plan views of a front (e.g., top or upper) surface and a rear (e.g., bottom or lower) surface, respectively, of a chip-on-lead semiconductor device 30 according to one or more embodiments of the present description after a metal deposition step as exemplified in FIG. 3E.

In one or more embodiments, the vias 37V' and/or 37V" may have a cross-section (e.g., a circular cross-section) having a smaller dimension (e.g., a diameter) of at least 30 μm. Optionally, the smaller dimension may be in the range of 30 μm to 70 μm. Optionally, the smaller dimension may be in the range of 40 μm to 60 μm. Optionally, the smaller dimension may be equal to about 50 μm.

It is noted that the process of manufacturing through-mold-vias by Laser Direct Structuring may lead to the formation of vias 37V' and 37V" having a substantially conical shape, i.e., having a cross section whose area tends to decrease from the surface 38A of the LDS material towards the surface 32A of the semiconductor die 32 and/or the surface of the leads 302. This may be due, for instance, to a loss of laser focus at different depths through the LDS material 38. Therefore, when referring to a "dimension" or "diameter" of a via 37V or line 37L in the context of the present description, such a dimension or diameter is intended as being measured at the front surface 38A of the LDS material 38, where the laser beam is focused during the step exemplified in FIG. 3D.

In one or more embodiments as exemplified in FIGS. 4A and 4B, the lead vias 37V" may have a sort of oval or elongated cross-section, with a first diameter d (or minor axis) measured in a direction perpendicular to the respective (lateral) side walls 32B and 38B of the semiconductor die 32 and the encapsulation casing 38, and a second diameter D (or major axis) measured in a direction parallel to the respective (lateral) side walls 32B and 38B and parallel to the plane of the front surface 32A of the semiconductor die 32.

In one or more embodiments, the length of the first diameter d may be at least 30 µm. Optionally, the length of the first diameter d may be in the range of 30 µm to 70 µm. Optionally, the length of the first diameter d may be in the range of 40 µm to 60 µm. Optionally, the length of the first diameter d may be equal to about 50 µm.

In one or more embodiments, the length of the second diameter D may be dimensioned as a function of the thickness T of the LDS material 38 measured with respect to the front surface 302A of the leads 302 (i.e., the length of the second diameter D may be dimensioned as a function of the depth of the via 37V"). For instance, the length of the second diameter D may be equal to at least 0.8*T. Optionally, the length of the second diameter D may be in the range of 0.8*T to 1.2*T. Optionally, the length of the second diameter D may be in the range of 0.9*T to 1.1*T. Optionally, the length of the second diameter D may be equal to about T.

In one or more embodiments, the provision of oval vias 37V" may facilitate overcoming conventional plating process design rules (applicable to circular vias) which rely on a 1:1 aspect ratio (diameter vs. depth) of the vias. By resorting to oval vias, the shorter diameter d may be as short as 30 µm while the longer diameter D may be approximately equal to the thickness T of the LDS material 38.

Additionally or alternatively, the length of the second diameter D may be dimensioned as a function of the width W of the electrically-conductive leads 302. For instance, the length of the second diameter D may be equal to the width W minus the accuracy of the laser beam used during the LDS process. Such accuracy may be, for instance, in the range of 10 µm to 20 µm, possibly equal to 15 µm.

It is noted that, while the present description refers mainly to the provision of oval or elongated vias 37V", one or more embodiments may comprise vias 37V" having other shapes (e.g., square or rectangular) which can also be defined with reference to a first axis and a second axis.

In one or more embodiments, the distance (or clearance) d3 between a (lateral) side wall of a via 37" and the respective (lateral) side wall 32B of the semiconductor die 32 may be selected as a function of the accuracy of the laser beam used during the LDS process. Additionally or alternatively, the distance (or clearance) d3' between a (lateral) side wall of a via 37" and the respective (lateral) side wall 38B of the encapsulation casing 38 may be selected as a function of the accuracy of the laser beam used during the LDS process. Such distance d3 and/or d3' may be, for instance, of at least 10 µm. Optionally, the distance d3 and/or d3' may be in the range of 10 µm to 50 µm. Optionally, the distance d3 and/or d3' may be in the range of 15 µm to 30 µm. Optionally, the distance d3 and/or d3' may be equal to 20 µm.

Therefore, in one or more embodiments, the provision of vias 37" having a small first diameter d (e.g., as small as 30 µm) facilitates manufacturing chip-on-lead semiconductor devices wherein the distance D3 between the (lateral) side walls 32B of the semiconductor die 32 and the (lateral) side walls 38B of the encapsulation casing 38 is short.

For instance, the distance D3 may be as short as 60 µm, in the purely exemplary case of a via 37" having a minor axis d of 30 µm and being separated by 15 µm from each of the walls 32B and 38B. In another purely exemplary case, the distance D3 may be as short as 110 µm, in the case of a via 37" having a minor axis d of 50 µm and being separated by 30 µm from each of the walls 32B and 38B.

Therefore, in one or more embodiments the semiconductor die 32 may be arranged even on the majority of the area of the leads 302.

One or more embodiments may thus provide one or more of the following advantages: the area of the semiconductor die 32 can be as large as the area of the encapsulation casing, minus a certain margin or clearance D3 at each side, wherein the margin can be as small as, e.g., 60 µm or 110 µm; short leads 302 can be used on conventional QFN chip-on-lead semiconductor devices; reduced criticality and improved reliability of the semiconductor die bonding process as compared to conventional wire bonding processes may be achieved; and the contact area of oval/elongated vias 37V" may be increased with respect to conventional circular vias.

As exemplified herein, a semiconductor device (e.g., 30) may comprise: a support substrate (e.g., 300); electrically-conductive leads (e.g., 302) arranged around the support substrate, the electrically-conductive leads comprising respective proximal portions (e.g., 303) facing towards the support substrate and respective distal portions facing away from the support substrate, a semiconductor die (e.g., 32) arranged (e.g., 34) onto the support substrate and onto the proximal portions of one or more of the electrically-conductive leads, the semiconductor die comprising a set of bonding pads at a front surface thereof (e.g., 32A) which is opposed to the support substrate; a layer of laser-activatable material (e.g., 38) molded onto the semiconductor die and the electrically-conductive leads; and electrically-conductive formations (e.g., 37L, 37V) laser-structured at selected spatial locations of the laser-activatable material.

As exemplified herein, the electrically-conductive formations may comprise: i) first electrically-conductive vias (e.g., 37V') extending between the bonding pads at the front surface of the semiconductor die and a front surface (e.g., 38A) of the layer of laser-activatable material; ii) second electrically-conductive vias (e.g., 37V") extending between the distal portions of the electrically-conductive leads and the front surface of the layer of laser-activatable material; and iii) electrically-conductive lines (e.g., 37L) extending at the front surface of the layer of laser-activatable material and connecting selected first electrically-conductive vias to selected second electrically-conductive vias.

As exemplified herein, the first electrically-conductive vias and the second electrically-conductive vias may have a cross-section having a smaller dimension (e.g., d) of at least 30 µm, optionally may be in the range of 30 µm to 70 µm, optionally 40 µm to 60 µm, optionally about 50 µm.

As exemplified herein, the second electrically-conductive vias may have an elongated cross-section (e.g., approximately oval or ellipsoidal or rectangular) having a minor axis (e.g., d) extending in a direction perpendicular to a respective side wall (e.g., 32B) of the semiconductor die and a major axis (e.g., D) extending in a direction parallel to the respective side wall of the semiconductor die and to the front surface of the semiconductor die.

As exemplified herein, a length of the minor axis of the second electrically-conductive vias may be of at least 30 µm, optionally may be in the range of 30 μm to 70 μm, optionally 40 μm to 60 μm, optionally about 50 μm.

As exemplified herein, the layer of laser-activatable material may have a thickness T, and a length of the major axis of the second electrically-conductive vias may be equal to at least 0.8*T, optionally may be in the range of 0.8*T to 1.2*T, optionally 0.9*T to 1.1*T, optionally about the same as T.

As exemplified herein, said thickness T may be equal to at least 100 μm, optionally may be in the range of 100 μm to 140 μm, optionally 110 μm to 130 μm, optionally about 120 μm.

As exemplified herein, the electrically-conductive leads may have a width W, and a length of the major axis of the second electrically-conductive vias may be equal to the width W minus a value in the range of 10 μm to 20 μm, optionally minus a value of 15 μm.

As exemplified herein, a distance (e.g., d3) between the second electrically-conductive vias and a respective side wall of the semiconductor die may be equal to at least 10 μm, optionally may be in the range of 10 μm to 50 μm, optionally 15 μm to 30 μm, optionally about 20 μm.

As exemplified herein, a distance (e.g., d3') between the second electrically-conductive vias and a respective side wall of the layer of laser-activatable material may be equal to at least 10 μm, optionally may be in the range of 10 μm to 50 μm, optionally 15 μm to 30 μm, optionally about 20 μm.

As exemplified herein, the semiconductor device may further comprise a layer of encapsulation material (e.g., 39) deposited onto the front surface of the layer of laser-activatable material to encapsulate the electrically-conductive lines.

As exemplified herein, the semiconductor device may further comprise a layer of non-conductive die attach material (e.g., 34) attaching the semiconductor die onto the support substrate and onto the proximal portions of one or more of the electrically-conductive leads, the non-conductive die attach material optionally comprising a die attach film.

As exemplified herein, the semiconductor die arranged onto the support substrate may be longer and/or wider than the support substrate.

As exemplified herein, the support substrate may comprise a die pad of a metallic leadframe.

As exemplified herein, the electrically-conductive formations may comprise metallic material deposited by means of electroless deposition and/or galvanic deposition.

As exemplified herein, a method of manufacturing a semiconductor device may comprise: providing a support substrate and electrically-conductive leads arranged around the support substrate, wherein the electrically-conductive leads comprise respective proximal portions facing towards the support substrate and respective distal portions facing away from the support substrate; arranging a semiconductor die onto the support substrate and onto the proximal portions of one or more of the electrically-conductive leads, wherein the semiconductor die comprises a set of bonding pads at a front surface thereof which is opposed to the support substrate; forming a layer of laser-activatable material onto the semiconductor die and the electrically-conductive leads; and directing laser radiation onto the layer of laser-activatable material to pattern a set of laser-activated formations.

The set of laser-activated formations includes: i) first laser-activated vias extending between the bonding pads at the front surface of the semiconductor die and a front surface of the layer of laser-activatable material; ii) second laser-activated vias extending between the distal portions of the electrically-conductive leads and the front surface of the layer of laser-activatable material; iii) laser-activated lines extending at the front surface of the layer of laser-activatable material and connecting selected first laser-activated vias to selected second laser-activated vias.

The method of manufacture may further include depositing a metallic layer onto the first laser-activated vias, the second laser-activated vias and the laser-activated lines to provide respective first electrically-conductive vias, second electrically-conductive vias and electrically-conductive lines (37L).

Without prejudice to the underlying principles, the details and embodiments may vary, even significantly, with respect to what has been described by way of example only, without departing from the extent of protection.

The invention claimed is:

1. A semiconductor device, comprising:
   a support substrate;
   electrically-conductive leads arranged around the support substrate, the electrically-conductive leads comprising respective proximal portions facing towards said support substrate and respective distal portions facing away from said support substrate;
   a semiconductor die arranged onto said support substrate and onto the proximal portions of one or more of said electrically-conductive leads, the semiconductor die comprising a set of bonding pads at a front surface thereof which is opposed to the support substrate;
   a layer of laser-activatable material molded onto said semiconductor die and said electrically-conductive leads; and
   electrically-conductive formations, wherein said electrically-conductive formations comprise:
   i) first electrically-conductive vias extending between said set of bonding pads at said front surface of the semiconductor die and a front surface of said layer of laser-activatable material;
   ii) second electrically-conductive vias extending between said distal portions of said electrically-conductive leads and the front surface of said layer of laser-activatable material, wherein said second electrically-conductive vias have an oval cross-section having a minor axis extending in a direction perpendicular to a respective side wall of the semiconductor die and a major axis extending in a direction parallel to said respective side wall of the semiconductor die and to said front surface of the semiconductor die; and
   iii) electrically-conductive lines extending at said front surface of said layer of laser-activatable material and connecting selected first electrically-conductive vias to selected second electrically-conductive vias.

2. The semiconductor device of claim 1, wherein said first electrically-conductive vias and said second electrically-conductive vias have a cross-section having a smaller dimension equal to at least 30 μm.

3. The semiconductor device of claim 2, wherein a length of said minor axis is equal to at least 30 μm.

4. The semiconductor device of claim 3, wherein said layer of laser-activatable material has a thickness T, and wherein a length of said major axis is equal to at least 0.8*T.

5. The semiconductor device of claim 4, wherein said thickness T is equal to at least 100 μm.

6. The semiconductor device of claim 3, wherein said electrically-conductive leads have a width W, and wherein a length of said major axis is equal to said width W minus a value in a range of 10 μm to 20 μm.

7. The semiconductor device of claim 1, wherein a distance between said second electrically-conductive vias and a respective side wall of the semiconductor die is equal to at least 10 μm.

8. The semiconductor device of claim 1, wherein a distance between said second electrically-conductive vias and a respective side wall of the layer of laser-activatable material is equal to at least 10 μm.

9. The semiconductor device of claim 1, further comprising a layer of encapsulation material on said front surface of said layer of laser-activatable material to encapsulate said electrically-conductive lines.

10. The semiconductor device of claim 1, further comprising a layer of non-conductive die attach material attaching said semiconductor die onto said support substrate and onto said proximal portions of one or more of said electrically-conductive leads.

11. The semiconductor device of claim 10, wherein the layer of non-conductive die attach material comprised a die attach film.

12. The semiconductor device of claim 1, wherein said semiconductor die arranged onto said support substrate is larger than a corresponding dimension of said support substrate.

13. The semiconductor device of claim 1, wherein said support substrate comprises a die pad of a metallic leadframe.

14. The semiconductor device of claim 1, wherein said electrically-conductive formations comprise metallic material.

15. A method of manufacturing semiconductor devices, comprising:
arranging a semiconductor die onto a support substrate and onto proximal portions of one or more electrically-conductive leads arranged around the support substrate such that the electrically-conductive leads have respective proximal portions facing toward the support substrate and respective distal portions facing away from the support substrate, wherein the semiconductor die comprises a set of bonding pads at a front surface thereof which is opposed to the support substrate;
forming a layer of laser-activatable material on said semiconductor die and said electrically-conductive leads;
directing laser radiation onto said layer of laser-activatable material to pattern a set of laser-activated formations, wherein patterning said set of laser-activated formations includes:
i) patterning first laser-activated vias extending between said set of bonding pads at said front surface of the semiconductor die and a front surface of said layer of laser-activatable material,
ii) patterning second laser-activated vias to have an oval cross-section and to extend between said distal portions of said electrically-conductive leads and the front surface of said layer of laser-activatable material, and
iii) patterning laser-activated lines extending at said front surface of said layer of laser-activatable material and connecting selected first laser-activated vias to selected second laser-activated vias; and
depositing a metallic layer onto said first laser-activated vias, said second laser-activated vias and said laser-activated lines to provide respective first electrically-conductive vias, second electrically-conductive vias and electrically-conductive lines.

16. The method of claim 15, further comprising depositing a layer of encapsulation material onto said front surface of said layer of laser-activatable material to thereby encapsulate said electrically-conductive lines.

17. The method of claim 15, further comprising using a layer of non-conductive die attach material to attach said semiconductor die onto said support substrate and onto said proximal portions of one or more of said electrically-conductive leads.

18. The method of claim 17, wherein the layer of non-conductive die attach material comprises a die attach film.

\* \* \* \* \*